United States Patent
Kroon

(10) Patent No.: US 6,567,940 B1
(45) Date of Patent: May 20, 2003

(54) METHOD OF TESTING RANDOM-ACCESS MEMORY

(75) Inventor: Adriaan Kroon, Loenen aan der Vecht (NL)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/437,409

(22) Filed: Nov. 10, 1999

(30) Foreign Application Priority Data

Nov. 10, 1998 (EP) ............................................ 98309192

(51) Int. Cl.[7] ........................... G11C 29/00; G06F 11/00
(52) U.S. Cl. ....................................... 714/720; 714/742
(58) Field of Search ................................ 714/720, 719, 714/718, 733, 734, 735, 763, 819, 824, 822, 823, 736, 738, 742; 365/200, 201, 202, 189.07, 190

(56) References Cited

U.S. PATENT DOCUMENTS

| | | | | |
|---|---|---|---|---|
| 5,034,923 A | * | 7/1991 | Kuo et al. ............. | 365/189.01 |
| 5,471,482 A | * | 11/1995 | Byers et al. ................. | 714/719 |
| 5,699,508 A | | 12/1997 | Khashayar ............. | 395/183.18 |

* cited by examiner

Primary Examiner—Christine T. Tu

(57) ABSTRACT

A method of testing RAM without destroying the stored data consists of looping through the locations to be tested (21, 28, 29), and at each location, inverting the data stored in the location (22), loading the inverted data from the location to a register (23), inverting the data in the register (24), writing the twice-inverted data back to the location (25) and comparing the actual content of the location with the content of the register (26). The test fails (27) if any of the comparisons fails, whereupon the test can be terminated. The test succeeds (30) if the all of the locations have been tested without any of the comparisons having failed. Further tests may be carried out at a selected location only, to test for short circuits between data bus leads. The method contains fewer memory access operations that the conventional method, so it will be faster. The method will also detect bits that can be changed but not changed back again, as well as stuck bits.

8 Claims, 2 Drawing Sheets

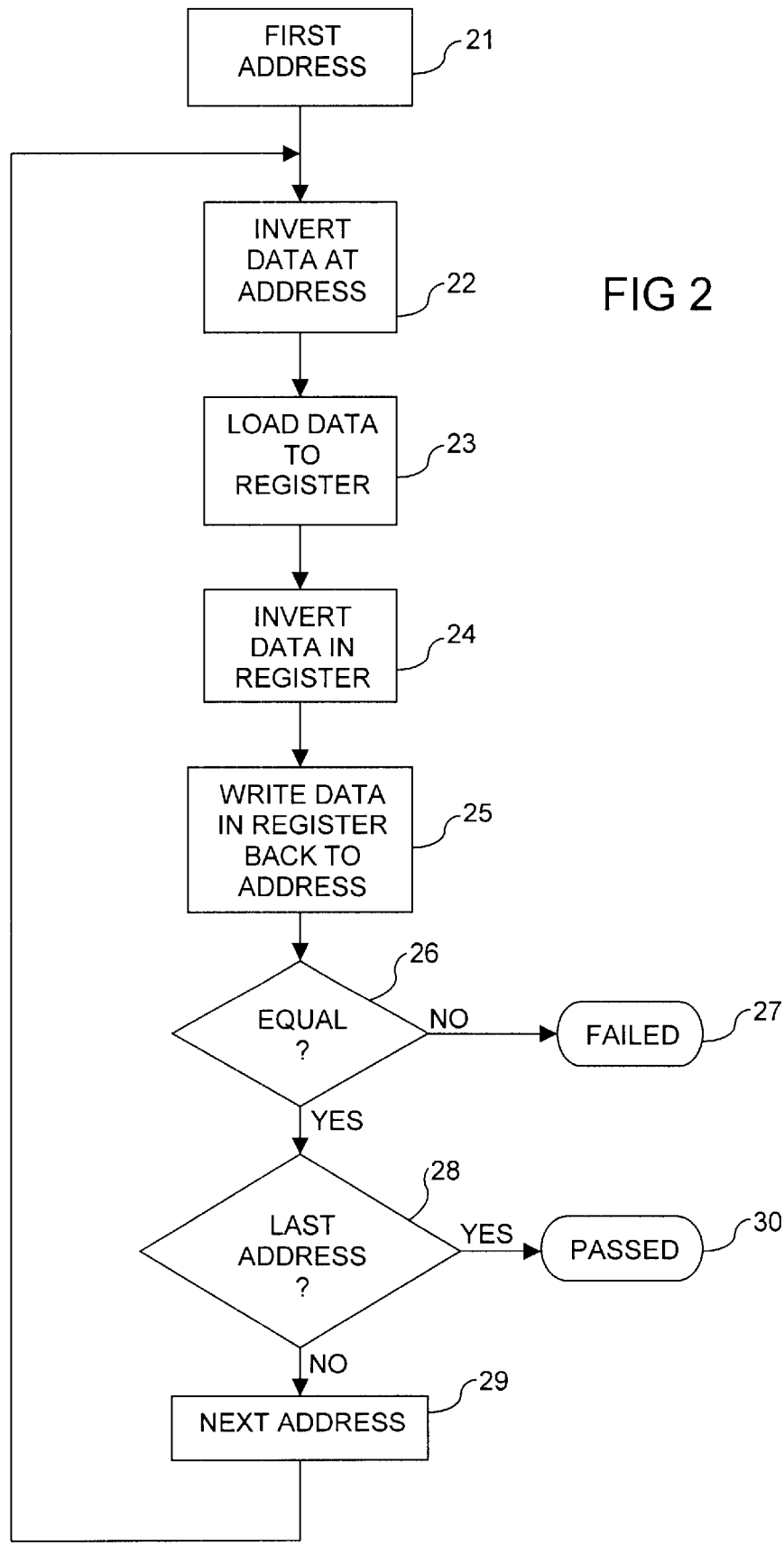

METHOD OF TESTING RANDOM-ACCESS MEMORY

CROSS-REFERENCE TO RELATED APPLICATION

This application claims priority of European Patent Application No. 98309192.7, which was filed on Nov. 10, 1998.

FIELD OF THE INVENTION

This invention relates to methods of testing random-access memory (RAM) without destroying the data stored in the memory.

BACKGROUND OF THE INVENTION

The conventional method of testing RAM is to cycle through all the addresses to be tested, and for each address to write a first test pattern consisting of a series of alternating ones and zeroes to the address and to compare what is actually stored at the address with the first test pattern and then to write a second test pattern consisting of the complementary series of alternating zeroes and ones to the address and to compare what is actually stored at the address with the second complementary test pattern. If any of the comparisons fails, the test fails and can be aborted at that point; if none of them fails the test succeeds.

A problem with this method is that any data stored in the RAM is overwritten and therefore lost. To avoid this it is necessary to load the data stored in the location into a register before applying the test patterns and to restore it afterwards. Thus the full method takes the form: For each address:

Load the data stored at the address into a register

Write the first test pattern (10101010 . . . ) to the address

Compare the data stored at the address with the first test pattern

Jump to FAILED if the comparison shows that they are not the same

Write the second test pattern (01010101 . . . ) to the address

Compare the data stored at the address with the second test pattern

Jump to FAILED if the comparison shows that they are not the same

Restore the original data from the register to the address. This method includes three read and three write operations as well as two comparison instructions and two conditional jumps and furthermore does not reliably test for locations that can only be set or cleared once.

SUMMARY OF THE INVENTION

The invention is as set out in claim 1.

With the claimed method each bit at the address being tested is changed twice, once when the original data word is inverted and once when the twice-inverted data word is written back to the address. The comparison will fail unless both changes are correctly made. Furthermore, the method contains only two write operations in addition to three read operations and only has one comparison instruction and one conditional jump.

BRIEF DESCRIPTION OF THE DRAWINGS

An embodiment of the invention will now be described with reference to the accompanying drawings of which:

FIG. 2 shows a flow diagram of a method according to the invention.

DETAILED DESCRIPTION OF THE INVENTION

Figure 1:
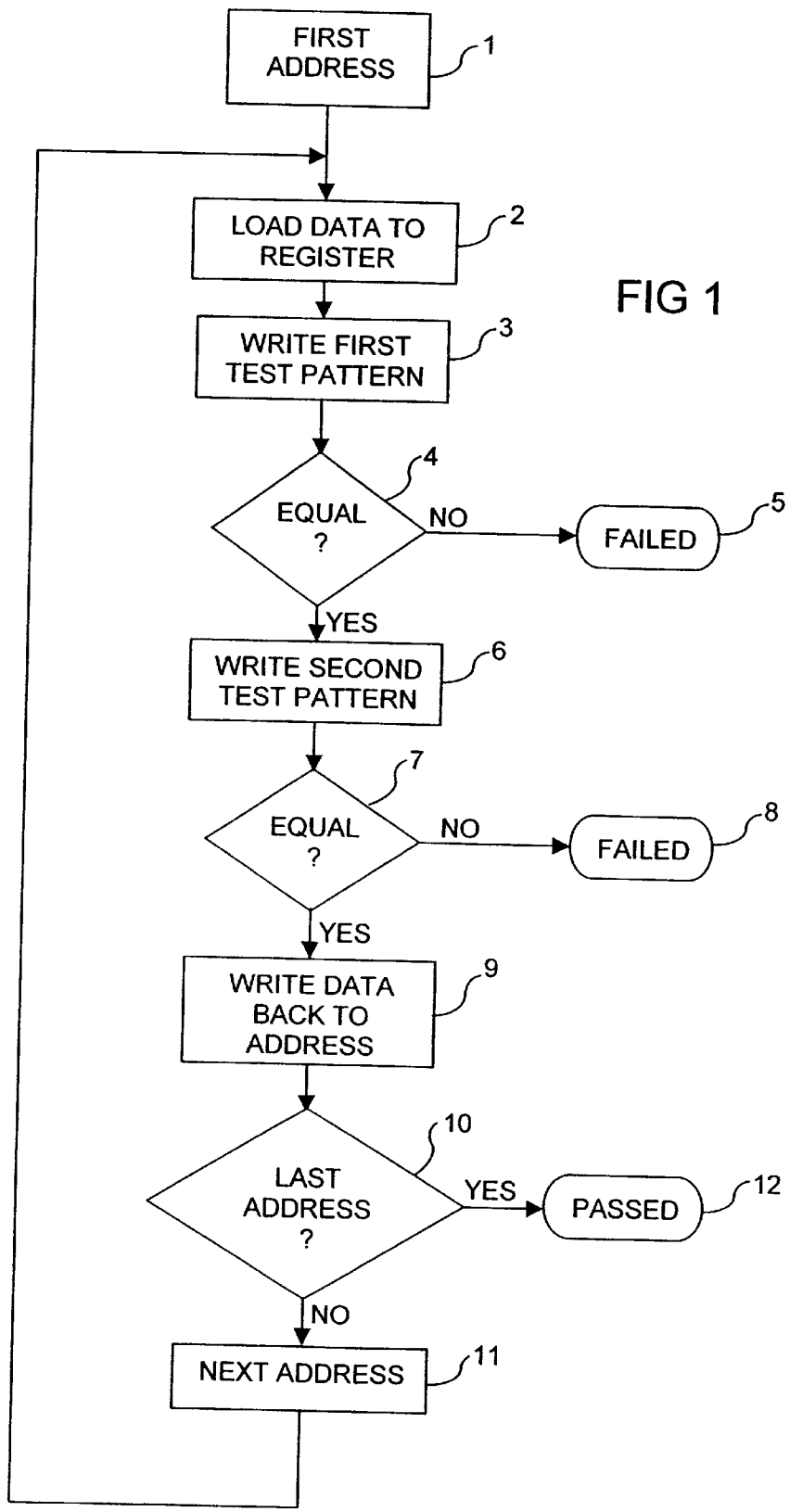
FIG. 1 shows a flow diagram of a conventional testing method.

In the following description exemplary data words will be illustrated as containing eight bits, for the sake of simplicity. As will be appreciated, sixteen or 32 bits is a more usual number and the method does not depend on the number of bits in a data word.

As illustrated in FIG. 1 the conventional method starts at the first address to be tested (1). The data word stored at that address is first loaded into a register (2) and a first test pattern such as 10101010 is written to the addressed location (3). The actual content of the location is then compared with the first test pattern (4) and if they do not agree the test is failed (5).

If they do agree a second test pattern, complementary to the first, such as 01010101, is written to the location (6) and the actual content of the location compared with the second test pattern (7). Once again, if they do not agree the test is failed (8).

Next the original data word is written back to the location (9) and, if the last address to be tested has not been reached (10), the method proceeds to the next address (11) and repeats the test. If the last address has been reached the test is passed (12).

Since each bit has been set to "1" and to "0" by the test patterns and tested, this method will detect any bit that is stuck at either "0" or "1". However, it will not reliably detect a condition in which a bit can be changed one way but not restored to its original value. For example, if the third bit was originally equal to "1" and could be cleared to "0" but not reset to "1" the first test pattern would not change it, so the first comparison 4 would indicate agreement, and the second test pattern could change it to "0", so the second comparison would also indicate agreement. Furthermore this method involves three write-to-memory operations, namely steps 3, 6 and 9 in addition to three read operations, namely the load to register step 2 and the two comparison steps 4 and 7.

To demonstrate the operation of the method illustrated in FIG. 2, we suppose that the first address to be tested contains the word 10110110. The testing method starts with the first address to be tested (21) and inverts all of the bits in the word stored at that address (22). On the assumption that the memory is working correctly, the addressed location now contains the word 01001001. That word is now loaded into a register of the microprocessor controlling the testing method (23). This register now also contains the word 01001001. Next, all of the bits in the register are inverted (24), so the register now contains the word 10110110 which, since two inversions have been carried out, is the same as the word originally stored at the addressed location. Now the word in the register is written back to the addressed location (25), which now contains the originally stored word, and the contents of the addressed location are compared with the contents of the register (26). If they are not equal, the test is failed, and may be stopped (27). However, under our assumption that the memory is working, they are equal, so the method proceeds to the next address (29) and repeats the test. When the last address has been tested (28), no failures having taken place, the method terminates (30), the memory having passed the test.

We now consider a case in which the third bit in the word is stuck. The addressed location being tested now contains the word 10110110 as before, but after the first inversion step 22 it contains the word 01101001 since the third digit, which is a "1", sticks at the same value. After the second inversion step 24 the register contains the word 10010110. The third digit is a "0" rather than a "1" as before. After this word is written back into the addressed location, the location actually contains the word 10110110 again, rather that 10010110 as contained in the register, since the third bit is still stuck to "1". Since the contents of the addressed location are different from those of the register the comparison step 26 gives a "NO". result and the test is failed (27).

Next we consider a case in which the third bit can be cleared (changed from its present value of "1" to "0") but not set to "1" again. In this case the first inversion step 22 gives the correct result of 01001001, and the second inversion step 24 also gives the correct result of 10110110, but the writing back step 25 cannot successfully write this to the addressed location, since the third bit is now "0" and cannot be set to "1". Therefore, after the writing back step, the addressed location contains 10010110 and, since this is different from the word contained in the register, the comparison step 26 gives a "NO" result and once again the test is failed.

Thus, to pass the test, each bit must be successfully changed and changed back again. The test is failed not only if a bit cannot be changed (is stuck) but if, having been changed, it cannot be restored to its original value.

The method contains only two write-to-memory operations, namely the first inversion step 22, which is a read-and-write step, and the writing back step 25. This leads to a considerable speed advantage, since the test has to be carried out on a large number of locations. This is especially important when the method is to be carried out periodically as a background process with minimum adverse effect on other processing.

On the other hand, by using test patterns consisting of alternating "1"s and "0"s the conventional method can detect cases in which there are short circuits between odd and even data bus leads, so that setting one bit will affect an adjacent bit. If this is happening at all, however, it will not only happen at one memory location but all of them, so it could be tested for by carrying out a test at a selected location. This could consist of carrying out the conventional test, but it would not add appreciably to the system load, since it would not have to be repeated for every location. Better still, a series of test patterns could be used to test for short circuits between any pair of bus leads, not just adjacent ones. Such a series of test patterns could, for example, consist of 10101010, 11001100, 11110000 and so on (for a word with more than eight bits). In general, there would need to be n patterns if the number of bits in a word were $2^n$. These patterns would consist of alternating groups of $2^m$ "1"s and $2^m$ "0"s, where m is in the range 0 to n-1.

What is claimed is:

1. A method of testing a memory location in random-access memory while retaining actual data stored in said memory location comprising:
    deriving a known test data set by:
        inverting the actual data;
        storing the inverted actual data to a register; and
        inverting the inverted actual data in the register; and
    writing said known test data set to the memory location and comparing the content of the memory location after said writing with the known test data set;
    the test having succeeded if the comparison indicates that the content of the memory location after said writing is equal to the known test data set and having failed if the comparison indicates that the content of the memory location after said writing is not equal to the known test data set.

2. A method of testing a plurality of memory locations in a random-access memory comprising testing each memory location as claimed in claim 1 until either the test fails or all of the memory locations have been tested without the test having failed.

3. A method as claimed in claim 2, wherein said random access memory includes plural bus leads, said testing method further including carrying out a test for short circuits between said bus leads, by performing the test method of claim 1 on a selected one of said plurality of memory locations.

4. A method as claimed in claim 3 wherein the test for short circuits between said bus leads comprises:
    saving the contents of the selected memory location to a register;
    writing a series of test patterns to the selected memory location;
    for each of said test patterns, comparing the actual content of the selected location with the respective test pattern; and
    restoring the saved contents of the selected location from the register.

5. A method as claimed in claim 4 wherein the series of test patterns comprises a first pattern consisting of alternating "1"s and "0"s and a second pattern complementary to the first pattern.

6. A method as claimed in claim 4 wherein the number of bits stored at a memory location is $2^n$ and the series of test patterns comprises n patterns consisting of alternating groups of $2^m$ "1"s and $2^m$ "0"s, where m is a variable integer that runs from 0 to n-1 and n is a fixed integer.

7. A method as claimed in any of claims 2, 3, 4, 5 or 6 carried out by a microprocessor under control of a stored program.

8. An apparatus for testing a memory location in random-access memory while retaining actual data stored in said memory location, comprising a microprocessor programmed to:
    derive a known test data set by:
        inverting the actual data;
        storing the inverted actual data to a register; and
        inverting the inverted actual data in the register; and
    write a known test data set to a memory location and to compare the content of the memory location after said writing with the known test data set;
    the test having succeeded if the comparison indicates that the content of the memory location after said writing is equal to the known test data set and having failed if the comparison indicates that the content of the memory location after said writing is not equal to the known test data set.

* * * * *